United States Patent [19]

Reddy

[11] Patent Number: 4,659,406

[45] Date of Patent: Apr. 21, 1987

[54] METHOD OF BONDING TO CERAMIC AND GLASS

[75] Inventor: Srinivasa S. N. Reddy, LaGrangeville, N.Y.

[73] Assignee: International Business Machines Corporation, Armonk, N.Y.

[21] Appl. No.: 725,598

[22] Filed: Apr. 22, 1985

[51] Int. Cl.<sup>4</sup> .................. B32B 18/00; B32B 31/06
[52] U.S. Cl. .................................... 156/89; 252/518
[58] Field of Search .................. 156/89; 252/500, 512, 252/518

[56] References Cited

U.S. PATENT DOCUMENTS

| | | | |
|---|---|---|---|
| 3,440,182 | 4/1969 | Hoffman | 252/518 |
| 4,155,475 | 5/1979 | DeLuca | 156/89 |
| 4,521,329 | 6/1985 | Siuta et al. | 252/518 |
| 4,540,604 | 9/1985 | Siuta | 252/518 |
| 4,554,035 | 11/1985 | Stein et al. | 156/89 |

Primary Examiner—Caleb Weston
Attorney, Agent, or Firm—Wolmar J. Stoffel

[57] ABSTRACT

The method of bonding metal elements to a glass or ceramic substrate that includes the steps of forming a particulate material of a eutectic composition of $Cu_2O$ and $P_2O_5$, combining the eutectic material with an organic vehicle and the metal elements to be bonded, and heating the combination to a temperature above the eutectic temperature of the eutectic material.

16 Claims, 2 Drawing Figures

METHOD OF BONDING TO CERAMIC AND GLASS

DESCRIPTION

1. Technical Field

This invention relates to thick film copper conductor compositions and methods of bonding, more particularly it relates to copper conductor compositions capable of forming a firm adhesive bond with ceramic and glass.

2. Background Art

Conductive compositions for thick film conductors made from noble metals containing a noble metal and a glass frit dispersed in an inert liquid vehicle are well known in the electronics art. Beneficial characteristics such as low resistivity, good solderability, and adhesion to a ceramic substrate vary according to the particular ingredients selected. An electrically conductive useful composition containing a silver metal is described in U.S. Pat. No. 4,001,146. The high cost of silver and other noble metals has led to the search for other less expensive conductor metals. Copper is a leading contender in this category.

A particularly troublesome problem with noble metal conductors is their very prevalent lack of adhesion to the supporting substrate, in particular glass, ceramic or glass-ceramic surfaces. In the electronic packaging technology it is important that internal metallurgy, as well as surface metal patterns adhere well to the supporting substrate. Usually, the surface features of the conductive metal pattern serve as the point of connection to a semiconductor device or passive device such as a resistor or capacitor, etc. In addition, it may be necessary to bond I/O elements such as pins and other connections to pads associated with the metal pattern. When the adhesion between the pad and the substrate is poor, the connection between the device, I/O element, etc. is also poor.

Glass frit has been added to conductive paste embodying noble metals and copper metals to improve the bond between the resultant metal stripe and pad and substrate, as described in U.S. Pat. No. 3,943,168, and/or 4,072,771. However, this expedient has not been successful to materially strengthen the interface bond between a the screened-on metal pattern and the inorganic ceramic substrate. The resultant interface bond is not generally sufficient to meet the demands of the electronic industry. In addition, frit bonded conductors have generally been found to develop glass-rich interlayers between the conductor and the ceramic substrate after firing. This interface inhibits its heat transfer between the conductor and the substrate, and being brittle, is subject to cracking during thermal cycling with concomitant loss of adherence. It is also a region of low electrical conductivity.

U.S. Pat. No. 4,323,483 discloses in thick film copper conductor compositions the addition of lead oxide and bismuth oxide dispersed in an inert liquid vehicle. While the adhesion is improved, the improvement is not sufficient to meet the needs of the electronic packaging industry.

An object of this invention is to provide a composition and a method for bonding metal elements such as metal particles i.e. copper, etc., elements such as I/O pins, covers, and heat sinks to a ceramic or glass substrate.

Another object of this invention is to provide a composition and a method for forming conductive metallurgy patterns on ceramic or glass substrates having superior adhesions between the pattern and the substrate.

This invention provides a method that embodies use of a new conductor composition suitable for thick film copper conductor patterns that, when fired, exhibit excellent adhesion to a ceramic, glass or glass-ceramic substrate surface. This superior adhesion is produced by embodying in the conductor composition a eutectic composition that will form an effective bond between the inorganic substrate surface and the copper particles in the composition or copper elements. The conductor composition of the invention embodies a suitable vehicle and a solvent for the vehicle, and a eutectic composition of $Cu_2O$ and $P_2O_5$. The composition can also include Cu particles when it is used for forming electrically conductive metal stripes.

Another aspect of the invention is a method of bonding metal elements to a glass or ceramic substrate that includes the steps of forming a particulate material that includes a eutectic composition of $Cu_2O$ and $P_2O_5$, combining the particulate eutectic material with an inert liquid which forms a paste, depositing the paste on the surface of a ceramic or glass substrate, and heating the substrate to a temperature above the eutectic temperature of the particulate eutectic material. The method can be used to bond particulate copper particles to the substrate, or in the alternative, to bond elements such as I/O pins, covers, heat sinks, etc. to surfaces formed of ceramic or glass.

The invention also relates to a process for forming a copper conductor pattern on an inorganic substrate that has excellent adhesion between the resultant metallic pattern and the supporting substrate.

BRIEF DESCRIPTION OF THE DRAWINGS

The Figure of the drawing is a phase diagram of $Cu_2O$ and $P_2O_5$ versus temperature which depicts the eutectic compositions useful in the practice of the invention.

A more complete understanding of the present invention can be obtained by considering the following detailed description in conjunction with the accompanying drawings in which.

DETAILED DESCRIPTION OF THE INVENTION

In this invention an ingredient is added to a bonding composition that bonds to both the metal and ceramic or glass when heated. It involves the recognition that a specific eutectic material, that melts at a reasonably low temperature, has a phosphate that interacts and bonds to the oxide of the ceramic or glass, and also a cuprous oxide which will bond to metal most preferably copper.

The invention is a solution to a very troublesome problem in the semiconductor packaging technology, and possibly in other technologies, i.e. that of obtaining a consistent and firm bond between metals that have high conductivity and a supporting glass, ceramic or glass/ceramic surface. Adhesion between copper and ceramic is improved by having an interface of very low energy. This can be achieved when copper chemically reacts with the oxide substrate and a thin layer is formed at the interface that contains the copper and elements of the ceramic. Since oxide interacts strongly with $P_2O_5$ and forms stable phosphates, the addition of small amounts of copper phosphates to copper result in a low energy reactive interface between the copper and the ceramic substrate.

Figure 2:
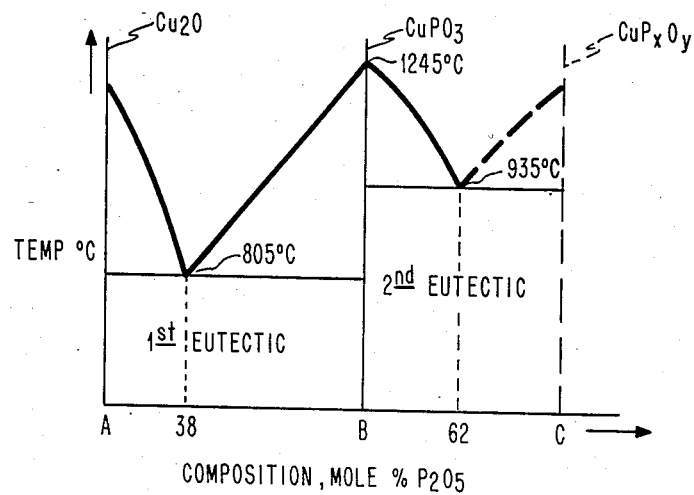
FIG. 2 is a portion of a phase diagram which illustrates the characteristics of the eutectic necessary in carrying out the invention.

Referring now to FIG. 2 of the drawings, there is depicted a partial phase diagram of $Cu_2O$ and $P_2O_5$. As is indicated, a first eutectic is formed of a combination of $Cu_2O$ and $CuPO_3$ with a melting point of 805° C. In addition, a second eutectic of $CuPO_3$ and a higher copper phosphate also can be formed having a melting point of 935° C. In the practice of our invention, either the first eutectic or the second eutectic depicted in FIG. 2 can be used in the practice thereof.

Figure 1:
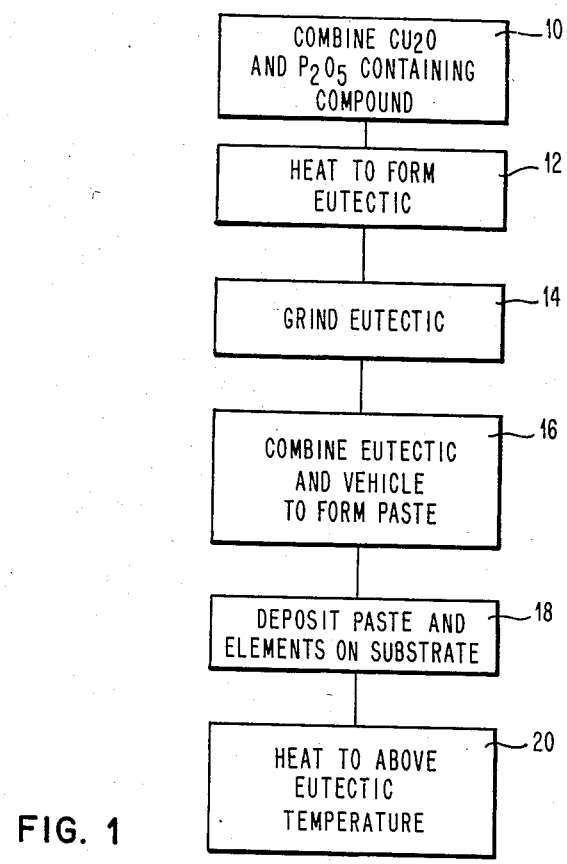
FIG. 1 is a flow chart of the steps taken in carrying out the present invention.

Referring now to FIG. 1 of the drawing, block 10 indicates the first step of the method of my invention, i.e. forming the eutectic composition for use in the bonding composition. Either of the eutectic compositions depicted in FIG. 2 can be used in the practice of my invention. Basically forming the eutectic involves combining $Cu_2O$ and a compound that will provide $P_2O_5$. A preferred ingredient is ammonium hydrogen phosphate. $P_2O_5$ could be used directly, but this requires that the mixing and heating be done in an a sealed system; other suitable sources of $P_2O_5$ can be used. After the $Cu_2O$ and ammonium hydrogen phosphate have been combined in the desired proportions, the mixture is heated to the eutectic temperature as indicated by block 12. The eutectic temperature depends on which eutectic is being formed. If it is desired to form the first eutectic with a melting point of 805° C., the mole percent of $Cu_2O$ in $Cu_2O$ and $P_2O_5$ mixture should be less than 100 and greater than 50, more preferably from 65 to 55. The ingredients need not be combined in the precise molar ratio of the eutectic since an excess of either the $Cu_2O$ and $P_2O_5$ is not detrimental in the composition. When the second eutectic with a melting point of 935° C. is desired, the mole percent of $Cu_2O$ in the mixture of the $Cu_2O$ and $P_2O_5$ should be less than 50, more particularly from 45 to 35. While both eutectics work in the practice of the invention, the second eutectic is preferred. When using either the first or second eutectic, it is generally advisable to use an inert gas such as nitrogen, argon, helium or wet inert gas with a controlled dew point during the process.

As indicated in block 14, the eutectic material after heating is allowed to cool and then is ground up to form a particulate material. The material can be ground in any suitable manner that is well known in the art. Preferably, the particles of the eutectic should have an average diameter of the order of 2-6 μm.

The resultant particulate eutectic material is then combined with a suitable inert liquid vehicle, to form a paste as indicated in block 16 of FIG. 1. Any suitable vehicle can be used to form the paste, as for example, butyl carbitol acetate based organic. The vehicle is used in any suitable proportion, normally constituting 5 to 40 weight percent of the total mixture. When the paste is to be used to form an electrically conductive metallurgy system, or a solderable area, copper particles are included. The basic paste of the eutectic and vehicle will bond copper elements, such as particles, pins, enclosures, heat sinks, clamps, etc. to any oxide ceramic material. The particulate copper can be combined in the paste in any suitable amount, typically forming 60 to 95 percent by weight of the total mixture. Other ingredients can also be added to the paste to vary its physical characteristics such as viscosity, surface tension, etc. In general, the amount of eutectic material in the paste can vary from 0.5 to 15 percent by weight.

As indicated in block 18, the copper paste of the invention is deposited on a ceramic or glass substrate. The deposition pattern is tailored to achieve the desired objective. The paste can be deposited in the form of an electrically conductive metallurgy pattern or solderable pattern on a semiconductor package substrate, or alternatively be deposited for bonding elements such as pins, electrical contacts, covers, heat sinks, and the like. When the paste is used to bond an element to a substrate, the element is placed in contact with the paste and preferably secured thereto. Normally the element to be secured is formed of copper or copper alloy. However, other metals can be secured by the process of the invention.

As indicated in block 20 of FIG. 2, the substrate is then heated to a temperature above the eutectic temperature of the texture of the paste in order to remove the organic vehicle and any other associated organic compounds of the paste, and bond the copper particles of the paste to each other and to the ceramic or glass material of the eutectic material. When the paste without copper particles is used as a bonding material, it bonds the metal element to the ceramic surface. As mentioned previously, the heating operation should be under a wet or dry inert atmosphere. In the case of second eutectic, the heating can be done in an atmosphere where oxygen partial pressure is slightly less than that required to form $Cu_2O$ because the phosphate eutectic will not decompose under these conditions.

The following examples are presented to depict preferred specific embodiments of the method and composition of the invention and should not be construed to unduly limit the scope and patent protection of the claims.

EXAMPLE I

A particulate compound of the first eutectic, as depicted in FIG. 2, was prepared by combining and mixing cuprous oxide ($Cu_2O$) and ammonium hydrogen phosphate $(NH_4)_2HPO_4$ powders. The quantities of the powders was measured and adjusted so that the composition was 53 weight percent $Cu_2O$ and 47 weight percent $(NH_4)_2 HPO_4$. After the powders were intimately mixed by grinding, the mixture was slowly heated in a platinum crucible in a $N_2$ ambient to 500° C., the temperature held for 1 hour, and cooled to room temperature. During this heating $(NH_4)_2 HPO_4$ reacts with $Cu_2O$ to make the phosphate and gaseous $N_2$ and$_2$ byproducts are driven off. The resultant mixture was then re-ground and heated to 850° C. in a platinum crucible for 1 hour in a $N_2$ ambient, cooled at a fast rate to room temperature, and again ground into powder. The final powder has the composition of 62 mole percent $Cu_2O$ and 38 mole percent $P_2O_5$. This powdered eutectic material is now ready for use in the bonding process and composition of the invention.

EXAMPLE 2

A particulate compound of the second eutectic, as depicted in FIG. 2 was prepared. The same basic procedure described in Example 1 was followed except that the composition was 28.2 weight percent $Cu_2O$ and 71.8 percent $(NH_4)_2 HPO_4$. Further the temperature of the second heating step was 950° C. The final composition is 42 mole percent $Cu_2O$ and 58 mole percent $P_2O_5$. The resultant powdered eutectic material of the second eutectic composition was now ready for use in the bonding process and composition of the invention.

EXAMPLE 3

An electrically conductive composition of the invention was prepared by mixing copper particles, with an average diameter of 2 μm, powder of the second eutectic, as described in Example 2, and in liquid organic vehicle. The resultant mixture had the following composition:

Copper Particles—81.6% by weight
Second eutectic material—3.4% by weight
Organic vehicle—15.0% by weight After thoroughly mixing the ingredients, the resultant paste was screened on an $Al_2O_3$ substrate. The screened pattern was in the form of circular pads of a diameter of 60 mils with a 3 mil thickness. The substrate and pattern was fired to 950° C. in a wet nitrogen ambient with a dew point that was less than room temperature for 2 hours. The small amount of moisture in wet atmosphere helps remove organic vehicle in the paste more completely. After firing, Kovar pins, with a head diameter corresponding to the pad diameter, were attached to the pads by solder, and pull tested using a tensile test machine. The machine applied a force to the pin that was perpendicular to the surface of the substrate. The force necessary to separate the pad from the substrate was measured and recorded. The average adhesion strength of the bond was calculated from the data and determined to be 16 pounds. This translates into an adhesion strength greater than 5800 psi.

EXAMPLE 4

The same procedure described in Example 3 was repeated to bond Kovar pins to a cordierite type ceramic substrate that contained Mg O, $Al_2O_3$, and $SiO_2$. The firing and testing was done as previously described. The average adhesion strength of the pin bond was 11.3 pounds which translates into an adhesion strength of 4100 psi.

EXAMPLE 5

In order to compare the adhesive strength obtained with the process and composition of the invention with the bond strength obtained by pastes in the art, a conductive paste was prepared which contained the following:

Copper particles—85% by weight
Organic vehicle—15% by weight

The same paste pattern described in Example 3 was deposited and fired with the aforedescribed conductive paste, which did not include the eutectic powder, on cordierite substrates as described in Example 4. Pins were bonded to the pads and pull tested as described in Example 3. The average adhesion strength was determined to be less than 1400 psi.

I claim:

1. A method of bonding at least one metal element to a ceramic or glass substrate comprising the steps of
forming a particulate material that includes a eutectic composition of $Cu_2O$ and $P_2O_5$ by preparing a mixture of $Cu_2O$ and a source of $P_2O_5$, heating the mixture, and grinding the resultant eutectic material,
combining the particulate eutectic material with a liquid organic vehicle to form a paste
depositing the paste on the surface of a ceramic substrate in contact with the element to be bonded, and
heating the substrate to a temperature above the eutectic temperature of the particulate eutectic material.

2. The method of claim 1 wherein said paste includes particulate Cu and is deposited on the substrate surface to form a metallurgy pattern.

3. The method of claim 2 wherein said substrate is a sintered ceramic substrate.

4. The method of claim 2 wherein said substrate is a laminated and sintered multi-layer ceramic substrate containing an internal metallurgy system.

5. The method of claim 4 wherein said multilayer substrate is formed of a plurality of green ceramic sheets that are assembled, laminated, and sintered.

6. The method of claim 5 wherein said substrate is formed of glass ceramic material.

7. The method of claim 1 wherein said source of $P_2O_5$ is ammonium hydrogen phosphate.

8. The method of claim 1 wherein said element is a Cu particle in said paste.

9. The method of claim 8 wherein said paste is deposited on the substrate to form a metallurgy pattern.

10. The method of claim 1 wherein said element is a metal element having a flat surface that is to be bonded to said substrate, the element positioned over and in contact with a pattern of the deposited paste on the substrate, and the resultant structure heated to above the eutectic temperature of said eutectic material.

11. A method of bonding at least one metal element to a ceramic or glass substrate comprised of the steps of:
forming a mixture of $Cu_2O$ and ammonium hydrogen phosphate, wherein the mole percent of $Cu_2O$ in the mixture is less than 100 and greater than 50,
heating the mixture to a temperature in excess of 805° C. wherein a eutectic composition is formed, and grinding the resultant composition,
combining the resultant particulate composition with an organic vehicle to form a paste,
depositing the paste on the surface of said substrate in contact with the element to be bonded, and
heating the substrate to a temperature in excess of 805° C.

12. The method of claim 11 wherein the mole ratio of $Cu_2O$ to ammonium hydrogen phosphate is such that in the eutectic of $Cu_2O$ and $P_2O_5$, the mole percent of $Cu_2O$ is approximately 62.

13. The method of claim 11 wherein said heating is done in dry or wet inert atmosphere.

14. A method of bonding at least one metal element to a ceramic or glass substrate comprising the steps of:
forming a mixture of $Cu_2O$ and ammonium hydrogen phosphate, wherein the mole percent of $Cu_2O$ in the mixture is less than 50,
heating the mixture to a temperature in excess of 915° C., wherein a eutectic composition is formed, and grinding the resultant composition,
combining the resultant particulate composition with an organic vehicle to form a paste,
depositing the paste on the surface of said substrate in contact with the element to be bonded, and
heating the substrate to a temperature in excess of 915°.

15. The method of claim 14 wherein the mole ratio of $Cu_2O$ to ammonium hydrogen phosphate is such that the resultant eutectic has approximately 42 mole percent $Cu_2O$ and 58 mole percent $P_2O_5$.

16. The method of claim 14 wherein said inert atmosphere is nitrogen, argon or helium.

* * * * *